(12) United States Patent
Bekas et al.

(10) Patent No.: US 10,614,150 B2
(45) Date of Patent: *Apr. 7, 2020

(54) HIGHER ACCURACY OF NON-VOLATILE MEMORY-BASED VECTOR MULTIPLICATION

(71) Applicant: International Business Machines Corporation, Armonk, NY (US)

(72) Inventors: Konstantinos Bekas, Horgen (CH); Alessandro Curioni, Gattikon (CH); Evangelos Stavros Eleftheriou, Rueschlikon (CH); Manuel Le Gallo-Bourdeau, Zurich (CH); Adelmo Cristiano Innocenza Malossi, Adliswil (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/276,745

(22) Filed: Feb. 15, 2019

(65) Prior Publication Data

US 2019/0179872 A1     Jun. 13, 2019

Related U.S. Application Data

(63) Continuation of application No. 15/654,510, filed on Jul. 19, 2017, now Pat. No. 10,210,138.

(51) Int. Cl.
*G06F 17/16* (2006.01)
*G11C 13/00* (2006.01)
(Continued)

(52) U.S. Cl.
CPC .............. *G06F 17/16* (2013.01); *G06F 7/523* (2013.01); *G06F 7/5443* (2013.01);
(Continued)

(58) Field of Classification Search
None
See application file for complete search history.

(56) References Cited

U.S. PATENT DOCUMENTS 9,009,095 B1 * 4/2015 Fafri ...................... G06F 17/18
706/52
9,152,827 B2   10/2015 Linderman et al.
(Continued)

FOREIGN PATENT DOCUMENTS

WO   2016068953 A1   5/2016
WO   2016099438 A1   6/2016

OTHER PUBLICATIONS

Gupta et al., "Deep Learning with Limited Numerical Precision," arXiv:1502.02551v1, Computing Research Repositry (CoRR), Feb. 9, 2015, pp. 1-10.
(Continued)

*Primary Examiner* — Michael D. Yaary
(74) *Attorney, Agent, or Firm* — Nathan M. Rau

(57) ABSTRACT

A multiplication device for performing a matrix-vector-multiplication may be provided. The multiplication device comprises a memristive crossbar array comprising a plurality of memristive devices. The device comprises a decomposition unit adapted for decomposing a matrix into a partial sum of multiple sub-matrices, and decomposing a vector into a sum of multiple sub-vectors, a programming unit adapted for programming the plurality of the memristive devices with values representing elements of the sub-matrices such that each one of the memristive devices corresponds to one of the elements of the sub-matrices, an applying unit adapted for applying elements of one of the multiple sub-vectors as input values to the memristive crossbar array to input lines of the memristive crossbar array resulting in partial results at output lines of the memristive
(Continued)

100 multiplication device crossbar array, and a summing unit adapted for scaling and summing the partial results building the product of the matrix and the vector.

20 Claims, 5 Drawing Sheets

(51) Int. Cl.
  *G06F 7/523* (2006.01)
  *G11C 7/10* (2006.01)
  *G06F 7/544* (2006.01)

(52) U.S. Cl.
  CPC .......... *G11C 7/1006* (2013.01); *G11C 13/003* (2013.01); *G11C 13/0007* (2013.01); *G11C 13/0069* (2013.01); *G06F 2207/4824* (2013.01); *G11C 2213/77* (2013.01)

(56) References Cited

U.S. PATENT DOCUMENTS

| | | |
|---|---|---|
| 9,336,870 B1 | 5/2016 | Mickel et al. |
| 9,489,343 B2 | 11/2016 | Bakos |
| 9,847,124 B2 | 12/2017 | Hu et al. |
| 9,910,827 B2 | 3/2018 | Muralimanohar et al. |
| 10,037,804 B1 | 7/2018 | Buchanan et al. |
| 2013/0028004 A1 | 1/2013 | Snider |
| 2014/0172937 A1 | 6/2014 | Linderman et al. |
| 2014/0208041 A1* | 7/2014 | Hyde ............... G06F 12/0831 711/146 |
| 2019/0026251 A1 | 1/2019 | Bekas et al. |

OTHER PUBLICATIONS

Hu et al., "Dot-Product Engine for Neuromorphic Computing: Programming 1T1M Crossbar to Accelerate Matrix-Vector Multiplication," DAC '16: Proceedings of the 53rd Annual Design Automation Conference, Jun. 2016, pp. 1-6, ACM, New York. DOI: 10.1145/2897937.2898010.

Richter et al., "Memristive Accelerator for Extreme Scale Linear Solvers," Proceedings of the Government Microcircuit Applications & Critical Technology Conference (GOMACTech), Mar. 2015, pp. 1-4. www.ece.rochester.edu/users/friedman/papers/GOMAC_15.pdf.

Zhou et al., "An Out-Of-Core Dataflow Middleware to Reduce the Cost of Large Scale Iterative Solvers," 2012 International Conference on Parallel Processing (ICPP) Workshops, Firth International Workshop on Parallel Programming Models and Systems Software for High-End Computing (P2S2), Sep. 2012, pp. 1-10. http://bmi.osu.edu/hpc/papers/Zhou12-P2S2.pdf.

Higham, N., Section 43: Compensated Summation of "Accuracy and Stability of Numerical Algorithms," Second Edition, 2002, 710 pages.

List of IBM Patents or Patent Applications Treated as Related, Signed Feb. 15, 2019, 2 pages.

\* cited by examiner

HIGHER ACCURACY OF NON-VOLATILE MEMORY-BASED VECTOR MULTIPLICATION

FIELD OF THE INVENTION

The disclosure relates generally to a device for performing a matrix-vector-multiplication, and more specifically, to a multiplication device comprising a memristive crossbar array comprising a plurality of memristive devices for performing a matrix-vector-multiplication. The disclosure relates further to a related method for performing a matrix-vector-multiplication, and a computer program product.

BACKGROUND

Mankind is entering the third era of computing, namely cognitive computing which holds great promise in delivering intelligence and knowledge from huge volumes of data. Today's cognitive computers are based on the von-Neumann architecture in which the computing and the memory units are separated. Cognitive computing is inherently data-centric, meaning that huge amounts of data need to be shuttled back and forth at high speeds, a task at which the von-Neumann architecture is highly inefficient. It is becoming increasingly clear that in order to build efficient cognitive computers, one needs to transform non von Neumann architectures where memory and logic coexist in some form.

The fascinating new area of "mem-computing" is a key non-von-Neumann approach being researched. The critical element in this novel computing paradigm is a very high-density, low-power, variable state, programmable and non-volatile nanoscale memory device. A fundamental computational primitive that can be realized entirely within such memory devices is a matrix-vector-multiplication. This primitive is of particular interest, as it forms the basis of several linear algebraic operations. Realizing the matrix-vector-computation entirely within memory devices could bring significant power and/or speed advantages compared to the conventional von Neumann approach where the data has to be shuttled back and forth between CPU and memory.

However, many challenges remain to be solved in order to perform accurate matrix-vector-computations in an array of memory devices. One of them is the limited precision and dynamic range that is possible to achieve in practice when coding matrix element as conductance values and vector elements as storage values. Increasing the precision of the matrix-vector-multiplications is important to be able to deal with a broader range of practical problems.

Beside a usage of this technique in cognitive computing, the problem of a fast and precise matrix-vector-multiplication is highly relevant in a wide field of technical and commercial computing. It may be used in data transformation in communication systems, e.g., mobile communication, in optimization problems, e.g., supply chain management or, in pricing optimization engines. Thus, being able to deliver a high-speed method for matrix-vector-multiplications is of interest across different vertical industries.

SUMMARY

According to one aspect of the present disclosure, a multiplication device for performing a matrix-vector-multiplication may be provided. The multiplication device may comprise a memristive crossbar array comprising a plurality of memristive devices. The multiplication device may comprise a decomposition unit adapted for decomposing a matrix into a partial sum of multiple sub-matrices, and decomposing a vector into a sum of multiple sub-vectors and a programming unit adapted for programming the plurality of the memristive devices with values representing elements of the sub-matrices such that each one of the memristive devices corresponds to one of the elements of the sub-matrices.

Additionally, the multiplication device may comprise an applying unit adapted for applying elements of one of the multiple sub-vectors as input values to the memristive crossbar array to input lines of the memristive crossbar array resulting in partial results at output lines of the memristive crossbar array and a summing unit adapted for scaling and summing the partial results building the product of the matrix and the vector.

According to another aspect of the present disclosure, a method for performing a matrix-vector-multiplication may be provided. The method may comprise providing a memristive crossbar array comprising a plurality of memristive devices and decomposing a matrix into a partial sum of multiple sub-matrices and decomposing a vector into a sum of multiple sub-vectors.

Furthermore, the method may comprise programming the plurality of the memristive devices with values representing elements of the sub-matrices such that each one of the memristive devices may correspond to one of the elements of the sub-matrices, applying elements of one of the multiple sub-vectors as input values to the memristive crossbar array to input lines of the memristive crossbar array resulting in partial results at output lines of the memristive crossbar array, and scaling and summing the partial results building the product of the matrix and the vector.

Furthermore, embodiments may take the form of a related computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

The proposed multiplication device for performing a matrix-vector-multiplication may offer multiple advantages and technical effects:

The imperfections of traditional approaches for matrix-vector-multiplications using memory devices, i.e., memristors, are addressed. Namely, the limited precision and dynamic range of these devices may no longer be on the critical path for high-precision of the matrix-factor-multiplication if the task may be properly mapped to the devices. For this, the original problem of the high-precision matrix-vector-multiplication is converted to a series of matrix-vector-multiplications using a plurality of crossbar memristive devices which may perform the transformed series of matrix-vector-multiplications in parallel.

Thus, it is not required to implement memristive devices with a higher precision and a higher dynamic range; instead standard, already available memristive devices, having a limited precision and a limited dynamic range, may be used. Thus, without implementing new production methods or device designs the precision of matrix-vector-multiplications may be used with state-of-the-art memristive devices.

In the following, additional embodiments of the proposed multiplication device—which embodiment may also be applicable for the proposed method—are being described:

According to an advantageous embodiment of the multiplication device, the groups of input values are voltage values at constant duration times. According to another advantageous embodiment of the multiplication device, the groups of input values may be duration times of constant voltage. Thus, different options for drivers may be available in order to provide the input values for the crossbar array. A selection may be made, according to higher-level decision criteria.

According to one optional embodiment of the multiplication device, the scaling and summing the partial results may be performed in a software module, e.g., in microcode. However, the scaling and summing may also be performed in hardware—e.g., using operational amplifiers—or in a mixture of hardware and software modules.

According to one preferred embodiment, the multiplication device may also comprise an integrated analogue/digital on-chip circuitry. The scaling and summing the partial results may be performed by the analogue/digital on-chip circuitry, which may be integrated as part of the multiplication device, either on-chip or off-chip in the same package. It may, for example be implemented in an FPGA (field programmable gate array).

According to one permissive embodiment of the multiplication device, the programming unit may also be adapted for programming the plurality of the memristive devices with values representing elements of the sub-matrices, one sub-matrix at a time. Thus, it may be assumed that the dimension of the matrix corresponds to the dimension of the crossbar array. However, if the number of available memristive devices in the crossbar array is larger than the dimension of the matrix, matrix-vector-multiplications of the sub-matrices and the sub-vectors may be performed in parallel. This may be much more effective than doing the multiplication of sub-matrices with sub-vectors—one combination at a time—sequentially.

Hence, according to another preferred embodiment of the multiplication device, the memristive crossbar array may be divided into a plurality of independent sub-crossbar arrays, and the programming the plurality of the memristive devices with values representing elements of the sub-matrices may be performed such that each sub-matrix may relate to a different one of the plurality of independent sub-crossbar arrays. The clear advantage compared to the sequential solution—described in the paragraph above—has a higher performance of the matrix-vector-multiplication.

According to a further advantageous embodiment of the multiplication device, a scaling factor $\alpha_l$ for one of the sub-matrixes $A_l$ and a scaling factor $\beta_m$ for one of the sub-vectors is selected such that $$P\left\{|\alpha_{l'}\beta_{m'}e_{l'm'}| > \left|\sum_{l\neq l',m\neq m'}\alpha_l\beta_m w_{lm}\right|\right\} < \varepsilon \ \forall \ l', m'$$

may be satisfied. Here,
- $e_{l'm'}$ is an error value defined as difference between an exact result vector element $w_{lm}$ of the product of one of the sub-matrices and one of the sub-vectors and an actually measured related product value,
- P is the probability that the norm value of $\alpha_{l'}\beta_{m'}e_{l'm'}$ is larger than the norm value of the sum $\Sigma_{l\neq l', m\neq m'}\alpha_l\beta_m w_{lm}$, and
- $\varepsilon$ is a predefined probability tolerance value.

The here described conditions may describe boundary conditions for the decomposition process and the decomposition unit according to which the unit is operating.

It may also be noted that throughout this document the vertical lines refer to the norm or norm value of the included values; the norm may be, e.g., the Euclidian norm, or another mathematical norm.

Alternative boundary conditions may be described by the next optional embodiment of the multiplication device. The scaling factor $\alpha_l$ for one of the sub-matrixes $A_l$ and a scaling factor $\beta_m$ for one of the sub-vectors may now be selected such that $$P\left\{\left|\sum_{l\cdot m}\alpha_l\beta_m e_{lm}\right| > |\alpha_{l'}\beta_{m'}w_{l'm'}|\right\} < \varepsilon \ \forall \ l', m'$$

may be satisfied. Here, again
- $e_{l'm'}$ is an error value defined as difference between an exact result vector element $w_{lm}$ of the product of one of the sub-matrices and one of the sub-vectors and an actually measured related product value,
- P is the probability that the norm value of the sum $\Sigma_{l,m}\alpha_l\beta_m e_{lm}$ is larger than the norm value $\alpha_{l'}\beta_{m'}w_{l'm'}$, and
- $\varepsilon$ is a predefined probability tolerance value.

Hence, depending on the expected preciseness and other limiting conditions—e.g., maximum complexity of the multiplication device—alternative boundary conditions for the decomposition of the original matrix for the matrix-vector-multiplication may be selected.

According to different embodiments of the multiplication device, the memristive device may be selected out of the group comprising a phase change memory, a metal oxide resistive random-access memory, a conductive bridge random access memory, a magnetic random access memory, an optical memory element, a ferroelectric random access memory. Furthermore, each of the memristive devices may be implemented as a system device, comprising transistors, resistors, capacitors, and/or inductors, jointly emulating a behavior of a memristive device.

BRIEF DESCRIPTION OF THE DRAWINGS

It should be noted that embodiments of the disclosure are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present disclosure are apparent from the examples of embodiments to be described hereinafter and are explained with reference to the examples of embodiments, but to which the disclosure is not limited.

Figure 1:
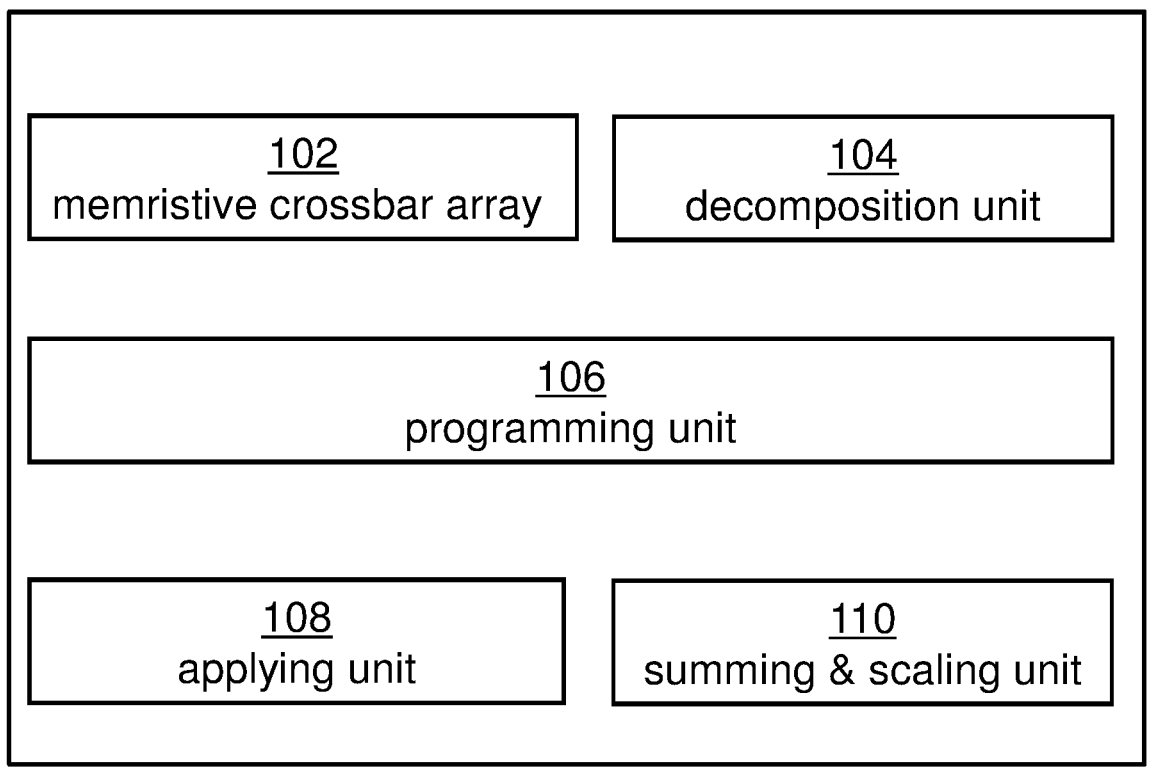

Preferred embodiments of the disclosure will now be described, by way of example only, and with reference to the following drawings:

FIG. 1 shows a block diagram of an embodiment of the inventive multiplication device for performing a matrix-vector-multiplication.

Figure 2:
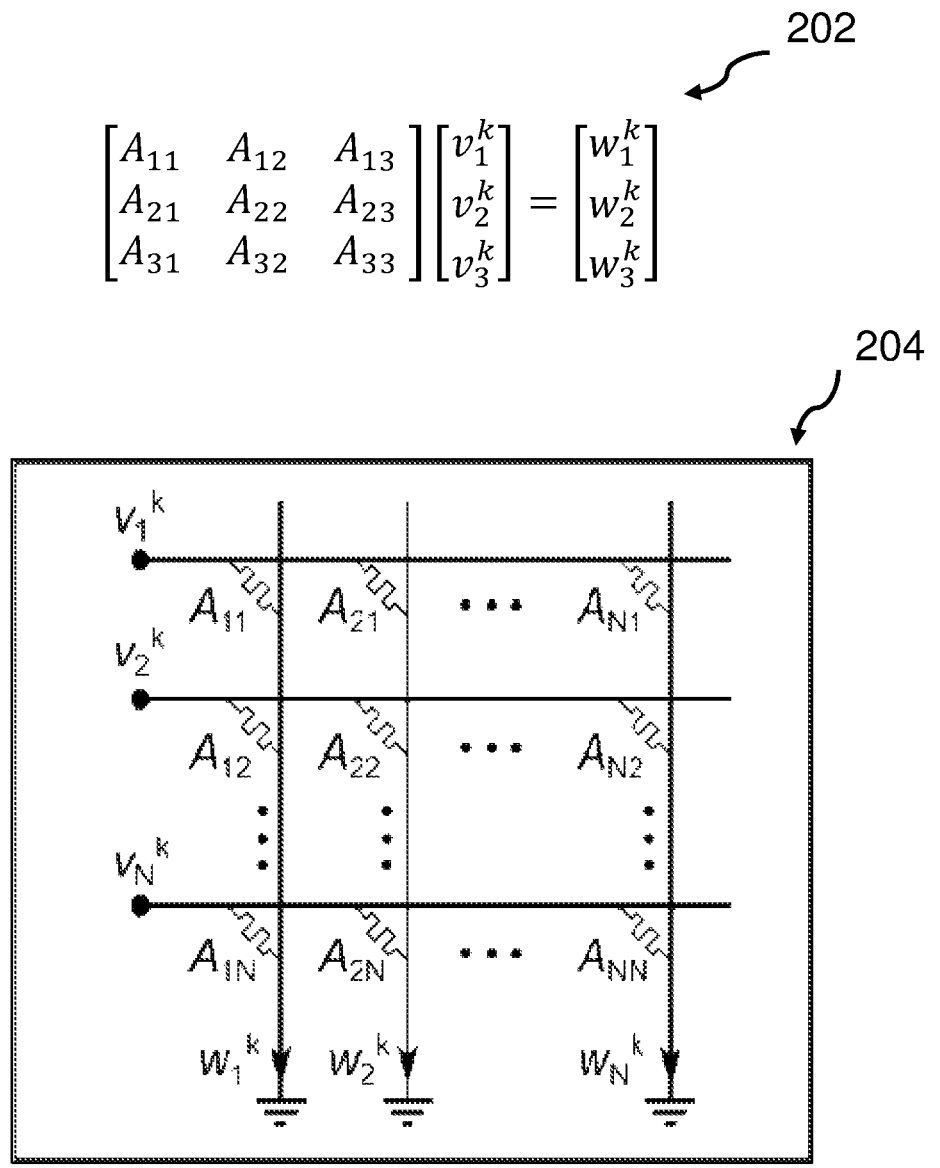
Figure 2:
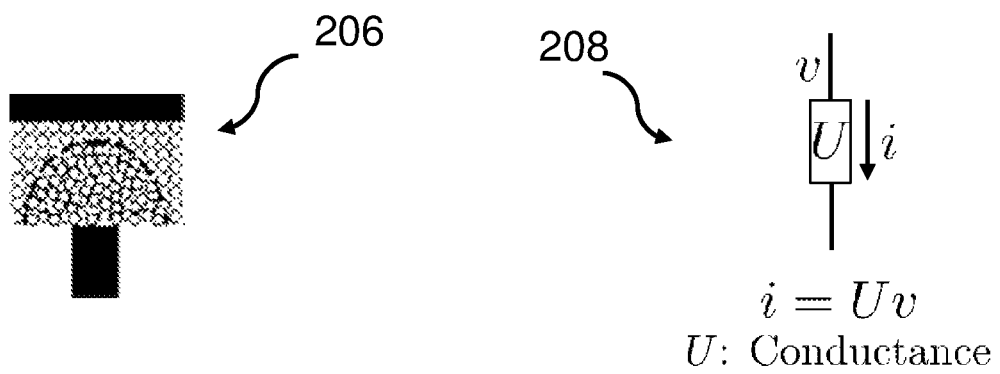

FIG. 2 shows a diagram how a matrix-vector-multiplication may be mapped to a crossbar of memristive devices according to embodiments.

Figure 3:
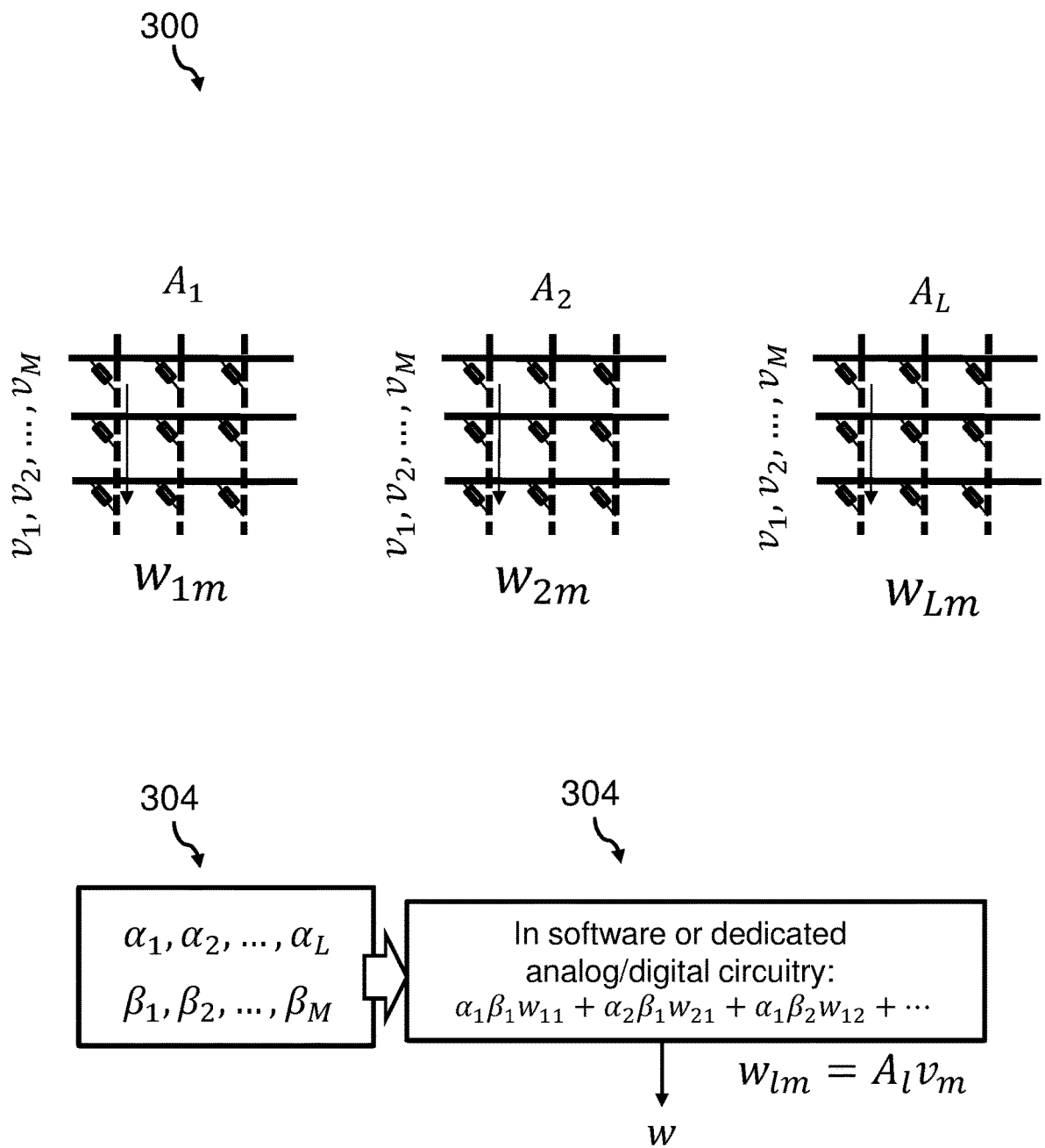

FIG. 3 shows a diagram of a way for decomposing the matrix A and the vector v according to embodiments.

Figure 4:
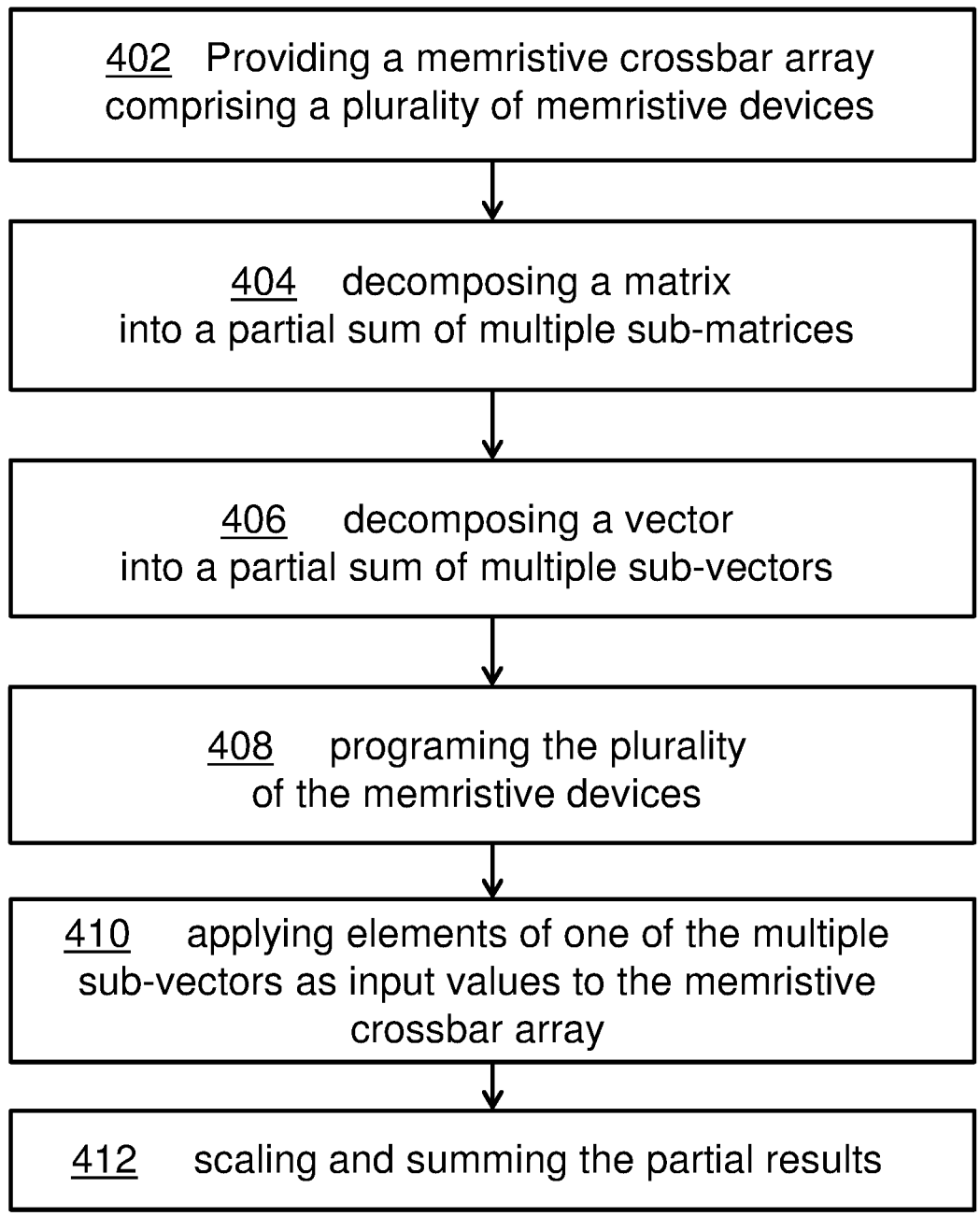

FIG. 4 shows a block diagram of an embodiment of the inventive method for performing a matrix-vector-multiplication according to embodiments.

Figure 5:
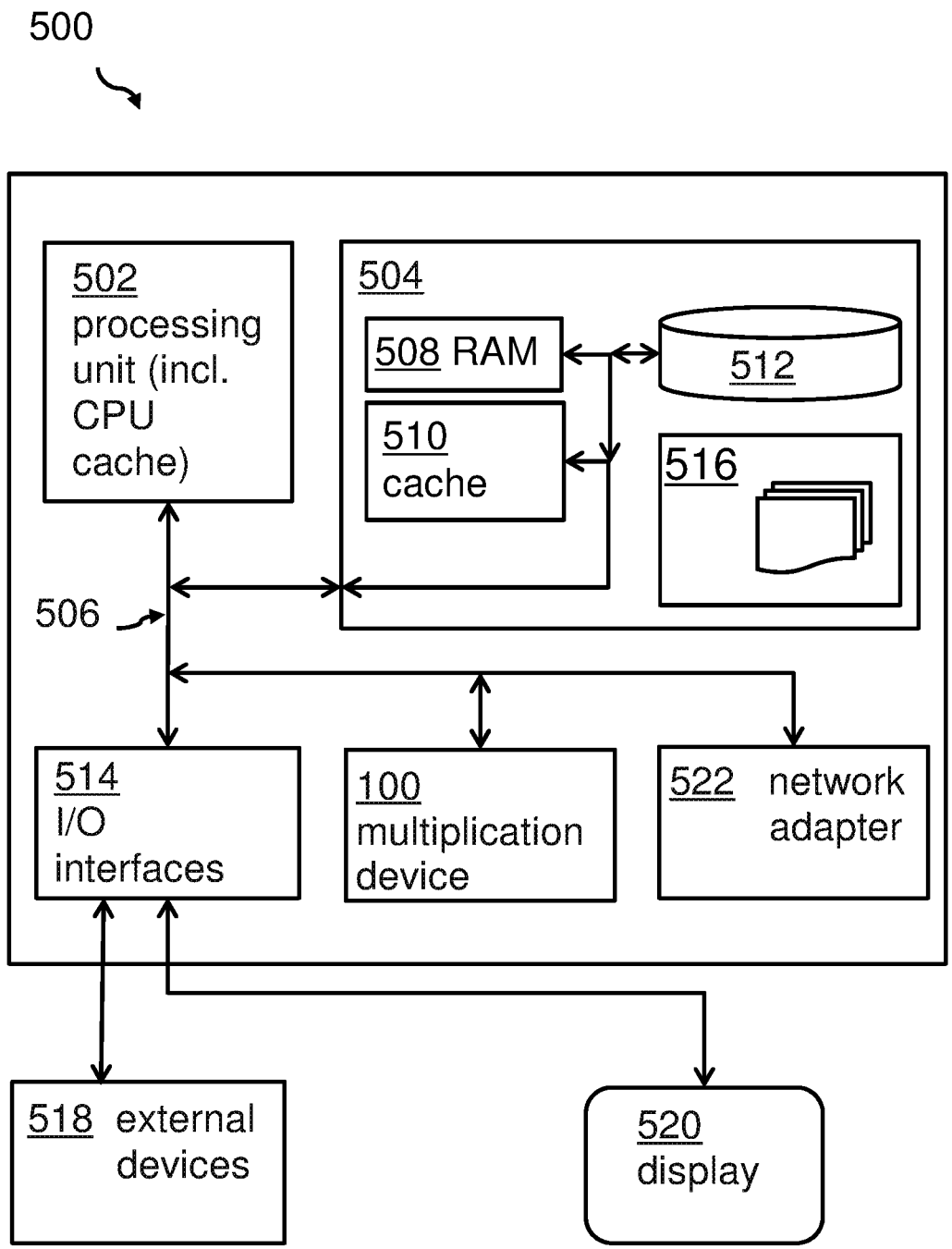

FIG. 5 shows an embodiment of a computing system comprising the multiplication device according to embodiments.

DETAILED DESCRIPTION

In the context of this description, the following conventions, terms and/or expressions may be used:

The term 'matrix-vector-multiplication' may denote a multiplication of a matrix of the disclosure N*M with a vector of dimension N resulting in a vector of dimension M using known mathematical principles. In special cases—which are favored as part of this document—the dimension of the matrix may be N*N.

The term 'memristive devices'—which is a portmanteau of "memory resistor"—may denote a hypothetical non-linear passive two-terminal electrical component relating to electric charge and magnetic flux linkage. According to the characterizing mathematical relations, the memristor would hypothetically operate in the following way: The memristor's electrical resistance is not constant but depends on the history of current that had previously flowed through the device, i.e., its present resistance depends on how much electric charge has flowed in what direction through it in the past; the device remembers its history—the so-called non-volatility property. When the electric power supply is turned off, the memristor remembers its most recent resistance until it is turned on again.

The term 'memristive crossbar array' may denote an array with crossed non-connected lines in an x-direction and a y-direction. At every cross point of the crossbar array, a memristive device is connected between an x-line and a crossing y-line.

The term 'decomposing a matrix into a partial sum' may denote the process of expressing a matrix as a sum of sub-matrices. Each sub-matrix may be multiplied with a scaling factor. Diverse mathematical decomposition methods are known. If in the context of this document the term 'sub-matrices' may be used, one should keep in mind that the sub-matrix is one of a group of sub-matrices derived from a source matrix.

The term 'integrated analogue/digital on-chip circuitry' may denote a converter for translating an analog signal into a digital signal. A variety of such translation techniques is known. The ADC may be implemented as a component of a larger chip or as a separate device. This device may be integrated with other chips in the same package.

The term 'plurality of independent sub-crossbar arrays' may denote a group of memristive crossbar arrays which may each be a component of a larger crossbar array of memristive devices. The memristive devices between the individual sub-crossbar arrays are not overlapping.

In the following, a detailed description of the figures will be given. All instructions in the figures are schematic. Firstly, a block diagram of an embodiment of the inventive multiplication device for performing a matrix-vector-multiplication is given. Afterwards, further embodiments, as well as embodiments of the method for performing a matrix-vector-multiplication, will be described.

FIG. 1 shows a block diagram of an embodiment of the inventive multiplication device 100 for performing a matrix-vector-multiplication according to embodiments. The multiplication device 100 comprises a memristive crossbar array 102 comprising a plurality of memristive devices. All of the memristive devices may be integrated together with related control circuitry, buffers and read-out logic on one chip. Alternatively, individual sub-chips may be integrated in one package.

The multiplication device comprises a decomposition unit 104 adapted for decomposing a matrix into a partial sum of multiple sub-matrices and decomposing a vector into a sum of multiple sub-vectors. The controller may be outside the chip of crossbar array or integrated together with it.

A programming unit 106 is adapted for programming the plurality of the memristive devices with values—e.g. conductance values—representing (e.g., proportional or otherwise dependent) elements of the sub-matrices such that each one of the memristive devices corresponds to one of the elements of the sub-matrices. In a first embodiment, the sub-matrices and sub-vectors may be processed one after the other; alternatively, they may be processed in parallel. For this, the crossbar array may be sub-divided into logical sub-arrays.

An applying unit 108 is adapted for applying elements of one of the multiple sub-vectors as input values to the memristive crossbar array to input lines of the memristive crossbar array resulting in partial results at output lines of the memristive crossbar array. Controller circuits may enable a proper and secure function of the multiplication process.

A summing unit 110 is adapted for scaling and summing the partial results building the product of the matrix and the vector. Thus, the sum of the partial results of the products of the matrix-vector-multiplication of the sub-matrices with the sub-vectors represents the result of the original matrix with the original vector at a significantly higher precision if compared to a simple matrix-vector-multiplication of the original matrix with the original vector using a straight memristive crossbar array.

FIG. 2 shows a diagram 200 how a matrix-vector-multiplication 202 may be mapped to a crossbar 204 of memristive devices according to embodiments. The formula 208 (Ohm's law) i=U*v, wherein i=current, U=conductance and v=voltage, together with Kirchhoff's laws build the basis of the core concept. For demonstration purposes, a 3×3 matrix is used here. However, any other dimension is as good as they here used example. The matrix elements $A_{11}$ to $A_{33}$ are mapped to the conductance values of the memristive devices as shown in 204. The vector component values $v^k_1$ to $v^k_3$ are used as input values for the memristive crossbar devices whereas the $w^k_1$ to $w^k_3$ values are the elements of the vector result of the performed multiplication.

The device 206 shows an amorphous and a crystalline area between a top and a bottom electrode of a memristive device. Depending on the mixture of the amorphous (lower half-sphere) and a crystalline area (atop and surrounding the half-sphere), the conductance of the device is changed. Ohm's law is shown by reference numeral 208 using the conductance instead of the potentially better known version using the resistance (U=R*I). The required "read power" (or required energy) of such devices can be as low as 1 to 100 fJ per device. It may perform multiplication several times given the almost unlimited read endurance. Additionally, the read-time is pretty fast, e.g., in the range of about 100 ns which means that a complete matrix-vector-multiplication may be performed in only 100 ns. Hence, no additional serialized multiplication and edition operations are required. The multiplication is basically executed instantly.

From a speed and power consumption perspective, this approach is already quite clever. However, in practical applications, the precision of the conductance programmed into the memristive devices in the crossbar and the limited dynamic range of the memristive devices limit the practical usability.

Therefore, the problem to solve the equation $$w = A * v,$$

wherein A is a matrix, w and v are vectors, is solved by decomposing the matrix A and the vector v as shown in FIG. 3, diagram 300.

The matrix A is decomposed into the matrices $A_1, A_2, \ldots A_L$. The same may apply to the vector v which may be decomposed into the vectors $v_1, v_2, \ldots v_M$. As result, the vector w may then be given by the sum shown in box 304 using scaling factors $\alpha_1, \alpha_2, \ldots \alpha_L$ and $\beta_1, \beta_2, \ldots, \beta_M$, compare 302. With this, a higher precision and a higher dynamic range may be achieved. Additionally, several embodiments as to how the memristive array decomposition has to be done may be implemented.

In other words: besides device-level improvements, the here proposed way to improve the precision is to encode single elements of the matrix A on multiple devices. The vector v can also be decomposed and applies as multiple sequential read voltages. In general, one can write $$A = \alpha_1 A_1 + \alpha_2 A_2 + \alpha_3 A_3 + \ldots + \alpha_L A_L$$

$$V = \beta_1 v_1 + \beta_2 v_2 + \beta_3 v_3 + \ldots \beta_M v_M.$$

Here, $\alpha_l$ and $\beta_l$ are scaling factors and $A_l$ and $v_m$ encode different levels of information of A and v. The matrix-vector-product w=Av is then calculated as $$w = \alpha_1 \beta_1 w_{11} + \alpha_2 \beta_1 w_{21} + \alpha_1 \beta_2 w_{12} + \ldots = \Sigma_{l,m}(\alpha_l \beta_m w_{lm})$$

$$w_{lm} = A_l v_m.$$

A preferred embodiment, the scaling factors $\alpha_l$ and $\beta_m$ should not lead to additional multiplication operations. In floating-point arithmetic, $\alpha_l$ and $\beta_m$ can be implemented by changing only the exponent. In fixed-point environment, $\alpha_l$ and $\beta_m$ can be implemented as bit-shifts for improved efficiency.

Thus, the new memristive crossbar array architecture—instead of a single A matrix—codes $A_l$ on multiple (L) crossbar arrays. The L arrays can only be sub-arrays of a larger array which and are physically located on the same (larger) array. The elements of $A_l$ are coded or programmed (as conductance values) on individual devices on multiple devices averaged.

Instead of a single read voltage vector, multiple read voltage vectors are applied sequentially in time. The voltages $v_m$ can be implied as M consecutive reads on all arrays. Only a re-scaling by $\alpha_l$ and $\beta_m$ and summing the partial results would be done in software of with some dedicated circuitry (mainly one or more analogue/digital converters).

In the following, two examples of mappings may be given:

Example 1

For improving the dynamic range, one can choose—for a first decomposition—$\alpha_l = \gamma a^l$ and $\beta_m = \delta b^m$. $\gamma$, a, $\delta$ and b can be either in decimal basis (powers of 10) or binary (powers of 2).

An example in decimal basis could be $\gamma = \delta = 10$, $a = b = 10^{-1}$ and $$A = A_1 + 10^{-1} A_2 + 10^{-2} A_3 + \ldots + 10^{-L+1} A_L$$

$$v = v_1 + 10^{-1} v_2 + 10^{-2} v_3 + \ldots + 10^{-M+1} v_M$$

$A_1$ contains the elements of A that are in [0.1,1[, $A_2$ the elements of A that are in [0.01,0.1[(multiplied by 10), etc. The same may apply for $v_1$, $v_2$, etc.

The elements of $A_l$ and $v_m$ are bounded in [0.1,1[, Assuming that A and v are normalized such that none of their elements are larger than 1, the above gives a complete representation of A and v for certain values of L and M.

A concrete example in binary basis could be $\gamma = \delta = 2^4$, $a = b = 2^{-4}$ and $$A = A_1 + 2^{-4} A_2 + 2^{-8} A_3 + \ldots + 2^{-4(L-1)} A_L$$

$$v = v_1 + 2^{-4} v_2 + 2^{-8} v_3 + \ldots + 2^{-4(M-1)} v_M$$

$A_1$ contains the elements of A that are in $[2^{-4},1[$, $A_2$ the elements of A that are in $[2^{-8}, 2^{-4}[$(multiplied by $2^4$), etc. The same applies to $v_1$, $v_2$, etc. It may be noted that if the computation of w is done in binary floating point arithmetic, no additional multiplications are introduced by the scaling factors $\alpha_l$ and $\beta_m$. Indeed, numbers in binary floating point are represented as $s/2^{p-1} \times 2^e$, thus $\alpha_l$ and $\beta_m$ are implemented only by changing the exponent e.

As explicit matrices one gets:

$$A = \begin{bmatrix} 0.9 & 0.03 & 0.6 \\ 0.0004 & 0.12 & 0.02 \\ 0.007 & 0.054 & 0.35 \end{bmatrix}$$

and thus $$A = \begin{bmatrix} 0.9 & 0 & 0.6 \\ 0 & 0.12 & 0 \\ 0 & 0 & 0.35 \end{bmatrix} +$$

$$10^{-1} \begin{bmatrix} 0 & 0.3 & 0 \\ 0 & 0 & 0.2 \\ 0 & 0.54 & 0 \end{bmatrix} + 10^{-2} \begin{bmatrix} 0 & 0 & 0 \\ 0 & 0 & 0 \\ 0.7 & 0 & 0 \end{bmatrix} + 10^{-3} \begin{bmatrix} 0 & 0 & 0 \\ 0.4 & 0 & 0 \\ 0 & 0 & 0 \end{bmatrix}$$

In this decomposition (last equation), the first matrix is $A_1$, the second matrix is $A_2$, the third matrix is $A_3$ and the fourth matrix is $A_4$.

In this example, only a limited dynamic range is needed to code both the conductance values ($A_l$) and voltage values ($v_m$) because they are bounded. This method effectively allows to code matrices A and vectors v having unlimited dynamic range. However, the elements of $A_l$ and $v_m$ have an unlimited number of digits. In practice, it is likely that the numbers beyond the first digit (in decimal basis) will be lost due to noise or other sources of inaccuracy.

In order to address this potential issue, a second example for improving both, the dynamic range and the precision of the matrix-vector-multiplication, is given:

Firstly, selected digits of A and v are coded into $A_l$ and $v_m$. E.g., using the first example above, but coding only the l-th digit of A in $A_l$, results in $$A = \begin{bmatrix} 0.9 & 0.03 & 0.6 \\ 0.0004 & 0.12 & 0.02 \\ 0.007 & 0.054 & 0.35 \end{bmatrix}$$

and thus, $$A = \begin{bmatrix} 0.9 & 0 & 0.6 \\ 0 & 0.1 & 0 \\ 0 & 0 & 0.3 \end{bmatrix} + 10^{-1} \begin{bmatrix} 0 & 0.3 & 0 \\ 0 & 0.2 & 0.2 \\ 0 & 0.5 & 0.5 \end{bmatrix} +$$

$$10^{-2} \begin{bmatrix} 0 & 0 & 0 \\ 0 & 0 & 0 \\ 0.7 & 0.4 & 0 \end{bmatrix} + 10^{-3} \begin{bmatrix} 0 & 0 & 0 \\ 0.4 & 0 & 0 \\ 0 & 0 & 0 \end{bmatrix}$$

Again, in this decomposition (last equation), the first matrix is $A_1$, the second matrix is $A_2$, the third matrix is $A_3$ and the fourth matrix is $A_4$.

The same can be done for the vector v. This way, we need only 1 digit of precision for each element of $A_l$ and $v_m$.

As a result: More than 1 digit can be coded in $A_l$ and $v_m$ if the hardware allows it.

For example, one could have $0.3698=0.36+10^{-2}\times 0.98$, e.g. two-digits precise coding. Here, 0.3698 is A. 0.36 is $A_1$. 0.98 is $A_2$.

The concept can be also applied to binary fixed-point representations in the same manner, i.e., 01101001=00000110<<4+00001001. Here, 01101001 is A, 0110 is $A_1$ and 1001 is $A_2$. The 4 most significant bits 0110 and the 4 least-significant bits 1001 can be coded separately. The left-shift<<4 represents the scaling factor ($\alpha$).

All the above is applicable to v as well. Many more examples based on the same principles are possible.

A third example can make this more transparent:

One codes in $A_l$ and $v_m$ only relevant elements of A and v, as required for the specific problem to be solved (e.g. solving the linear equation). E.g., one can code only the elements of A above a certain threshold, and/or up to a certain digit in $A_l$. One can code only a fixed number of elements per row/column of A (works for both, sparse and dense A). One can drop elements or digits of A depending on the resulting sparsity level of $A_l$ (i.e. drop $A_l$ is if $A_l$ is "very" sparse, for i=1, . . . , L).

Some elements can be coded with more digits than others. Some parts of the matrix can also be coded less precisely than others (e.g. higher threshold for drop-off or/and less digits). Those parts could be for example selected based on physical principles that led to the matrix A, or based on the right-hand side b when solving the linear equation Ax=b.

The splitting can be done based on the structure of A (e.g. code only a band around the main diagonal for diagonally-dominant matrices). All the above examples are applicable to v, as well.

In a more concrete form, and based on the second example, code A as in Embodiment 2, but up to the second digit only.

$$A = \begin{bmatrix} 0.9 & 0.03 & 0.6 \\ 0.0004 & 0.12 & 0.02 \\ 0.007 & 0.054 & 0.35 \end{bmatrix}$$

and hence $$\tilde{A} = \begin{bmatrix} 0.9 & 0 & 0.6 \\ 0 & 0.1 & 0 \\ 0 & 0 & 0.3 \end{bmatrix} + 10^{-1} \begin{bmatrix} 0 & 0.3 & 0 \\ 0 & 0.2 & 0.2 \\ 0 & 0.5 & 0.5 \end{bmatrix}$$

wherein the first matrix is $A_1$ and the second matrix is $A_2$.

The computation of w is then given by the summation $w = \alpha_1\beta_1 w_{11} + \alpha_2\beta_1 w_{21} + \beta_2 w_{12} + \ldots$ It may be that some elements of this sum fall out of range of the arithmetic format used to calculate it (due to large differences across the scaling factors $\alpha_l$ and $\beta_m$, e.g. $\alpha_1$ could be 1 whereas $\alpha_{16}$ is $10^{-16}$).

To avoid those errors, compensated summation algorithms, such as those given in Sec. 4.3 of N. J. Higham, *Accuracy and stability of numerical algorithms* (Siam, 2002), can be used.

FIG. 4 shows an embodiment of a formal flowchart of the inventive method 400 for performing a matrix-vector-multiplication according to embodiments. The method comprises providing, 402, a memristive crossbar array comprising a plurality of memristive devices, decomposing, 404, a matrix into a partial sum of multiple sub-matrices, and decomposing, 406, a vector into a sum of multiple sub-vectors.

Additionally, the method comprises programming, 408, the plurality of the memristive devices with values representing—in particular, being proportional to—elements of the sub-matrices such that each one of the memristive devices corresponds to one of the elements of the sub-matrices, applying, 410, elements of one of the multiple sub-vectors as input values to the memristive crossbar array to input lines of the memristive crossbar array resulting in partial results at output lines of the memristive crossbar array, and scaling and summing—412—the partial results building the product of the matrix and the vector.

Embodiments of the disclosure may be implemented together with virtually any type of computer, regardless of the platform being suitable for storing and/or executing program code. FIG. 5 shows, as an example, a computing system 500 suitable for executing program code related to the proposed method according to embodiments.

The computing system 500 is only one example of a suitable computer system and is not intended to suggest any limitation as to the scope of use or functionality of embodiments of the disclosure described herein. Regardless, computer system 500 is capable of being implemented and/or performing any of the functionality set forth hereinabove. In the computer system 500, there are components, which are operational with numerous other general purpose or special purpose computing system environments or configurations. Examples of well-known computing systems, environments, and/or configurations that may be suitable for use with computer system/server 500 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 500 may be described in the general context of computer system-executable instructions, such as program modules, being executed by a computer system 500. Generally, program modules may include routines, programs, objects, components, logic, data structures, and so on that perform particular tasks or implement particular abstract data types. Computer system/server 500 may be practiced in distributed cloud computing environments where tasks are performed by remote processing devices that are linked through a communications network. In a distributed cloud computing environment, program modules may be located in both local and remote computer system storage media including memory storage devices.

As shown in the figure, computer system/server 500 is shown in the form of a general-purpose computing device. The components of computer system/server 500 may include, but are not limited to, one or more processors or processing units 502, a system memory 504, and a bus 506 that couples various system components including system memory 504 to the processor 502. Bus 506 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 500 typically includes a variety of computer system readable media. Such media may be any available media that is accessible by computer system/server 500, and it includes both, volatile and non-volatile media, removable and non-removable media.

The system memory 504 may include computer system readable media in the form of volatile memory, such as random access memory (RAM) 508 and/or cache memory 510. Computer system/server 500 may further include other removable/non-removable, volatile/non-volatile computer system storage media. By way of example only, storage system 512 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 506 by one or more data media interfaces. As will be further depicted and described below, memory 504 may include at least one program product having a set (e.g., at least one) of program modules that are configured to carry out the functions of embodiments of the disclosure.

The program/utility, having a set (at least one) of program modules 516, may be stored in memory 504 by way of example, and not limitation, as well as an operating system, one or more application programs, other program modules, and program data. Each of the operating system, one or more application programs, other program modules, and program data or some combination thereof, may include an implementation of a networking environment. Program modules 516 generally carry out the functions and/or methodologies of embodiments of the disclosure as described herein.

The computer system/server 500 may also communicate with one or more external devices 518 such as a keyboard, a pointing device, a display 520, etc.; one or more devices that enable a user to interact with computer system/server 500; and/or any devices (e.g., network card, modem, etc.) that enable computer system/server 500 to communicate with one or more other computing devices. Such communication can occur via Input/Output (I/O) interfaces 514. Still yet, computer system/server 500 may communicate with one or more networks such as a local area network (LAN), a general wide area network (WAN), and/or a public network (e.g., the Internet) via network adapter 522. As depicted, network adapter 522 may communicate with the other components of computer system/server 500 via bus 506. It should be understood that although not shown, other hardware and/or software components could be used in conjunction with computer system/server 500. Examples, include, but are not limited to: microcode, device drivers, redundant processing units, external disk drive arrays, RAID systems, tape drives, and data archival storage systems, etc.

Additionally, the multiplication device 100 for performing a matrix-vector-multiplication can be attached to the bus system 506.

The descriptions of the various embodiments of the present disclosure have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present disclosure may be embodied as a system, a method, and/or a computer program product. The computer program product may include a computer readable storage medium (or media) having computer readable program instructions thereon for causing a processor to carry out aspects of the present disclosure.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the disclosure. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present disclosure has been presented for purposes of illustration and description, but is not intended to be exhaustive or limited to the disclosure in the form disclosed. Many modifications and variations will be apparent to those of ordinary skills in the art without departing from the scope and spirit of the disclosure. The embodiments are chosen and described in order to best explain the principles of the disclosure and the practical application, and to enable others of ordinary skills in the art to understand the disclosure for various embodiments with various modifications, as are suited to the particular use contemplated.

What is claimed is:

1. A multiplication device for performing a matrix-vector-multiplication, the multiplication device comprising a memristive crossbar array comprising a plurality of memristive devices, the multiplication device comprising:

a programming unit adapted for programming the plurality of the memristive devices with values representing elements of the sub-matrices such that each one of the memristive devices corresponds to one of the elements of the sub-matrices;

an applying unit adapted for applying elements of one of the multiple sub-vectors as input values to the memristive crossbar array to input lines of the memristive crossbar array resulting in partial results at output lines of the memristive crossbar array; and a summing unit adapted for scaling and summing the partial results building the product of the matrix and the vector.

2. The multiplication device according to claim 1, wherein the groups of input values are voltage values at constant duration times.

3. The multiplication device according to claim 1, wherein the groups of input values are duration times of constant voltage.

4. The multiplication device according to claim 1, wherein the scaling and summing the partial results is performed in a software module.

5. The multiplication device according to claim 1, further comprising:
an integrated analogue/digital on-chip circuitry;
wherein the scaling and summing the partial results is performed by the analogue/digital on-chip circuitry.

6. The multiplication device according to claim 1, wherein the programming unit is also adapted for programming the plurality of the memristive devices with values, representing elements of the sub-matrices is performed one sub-matrix at a time.

7. The multiplication device according to claim 1, wherein the memristive crossbar array is divided into a plurality of independent sub-crossbar arrays; and
wherein the programming the plurality of the memristive devices with values representing elements of the sub-matrices is performed such that each sub-matrix relates to a different one of the plurality of independent sub-crossbar arrays.

8. The multiplication device according to claim 1, wherein a scaling factor $\alpha_l$ for one of the sub-matrixes $A_l$ and a scaling factor $\beta_m$ for one of the sub-vectors is selected such that $$P\left\{|\alpha_{l'}\beta_{m'}e_{l'm'}| > \left|\sum_{l\neq l',m\neq m'}\alpha_l\beta_m w_{lm}\right|\right\} < \varepsilon \ \forall \ l', m'$$

is satisfied,
wherein:
$e_{l'm'}$ is an error value defined as difference between an exact result vector element $w_{lm}$ of the product of one of the sub-matrices and one of the sub-vectors and an actually measured related product value,
P is the probability that the norm value of $\alpha_{l'}\beta_{m'}e_{l'm'}$ is larger than the norm value of the sum $\Sigma_{l\neq l',m\neq m'}\alpha_l\beta_m w_{lm}$, and
$\varepsilon$ is a predefined probability tolerance value.

9. The multiplication device according to claim 1, wherein a scaling factor $\alpha_l$ for one of the sub-matrixes $A_l$ and a scaling factor $\beta_m$ for one of the sub-vectors is selected such that $$P\left\{\left|\sum_{l,m}\alpha_l\beta_m e_{lm}\right| > |\alpha_{l'}\beta_{m'}w_{l'm'}|\right\} < \varepsilon \ \forall \ l', m'$$

is satisfied, wherein:
$e_{l'm'}$ is an error value defined as difference between an exact result vector element $w_{lm}$ of the product of one of the sub-matrices and one of the sub-vectors and an actually measured related product value,
P is the probability that the norm value of the sum $\Sigma_{l,m}\alpha_l\beta_m e_{lm}$ is larger than the norm value $\alpha_{l'}\beta_{m'}w_{l'm'}$, and
$\varepsilon$ is a predefined probability tolerance value.

10. The multiplication device according to claim 1, wherein the memristive device is selected from the group consisting of a phase change memory, a metal oxide resistive random-access memory, a conductive bridge random access memory, a magnetic random access memory, an optical memory element, a ferroelectric random access memory, and a system device, comprising transistors, resistors, capacitors, and/or inductors, jointly emulating a behavior of a memristive device.

11. A method for performing a matrix-vector-multiplication, the method comprising:
providing a memristive crossbar array comprising a plurality of memristive devices;
programming the plurality of the memristive devices with values representing elements of a sub-matrices such that each one of the memristive devices corresponds to one of the elements of the sub-matrices;
applying elements of one of the multiple sub-vectors as input values to the memristive crossbar array to input lines of the memristive crossbar array resulting in partial results at output lines of the memristive crossbar array; and
scaling and summing the partial results building the product of the matrix and the vector.

12. The method according to claim 11, wherein the groups of input values are voltage values at constant duration times.

13. The method according to claim 11, wherein the groups of input values are duration times of constant voltage.

14. The method according to claim 11, wherein the scaling and summing the partial results is performed in a software module.

15. The method according to claim 11, wherein the scaling and summing the partial results is performed by an analogue/digital on-chip circuitry.

16. The method according to claim 11, further comprising;
programming the plurality of the memristive devices with values, representing elements of the sub-matrices is performed one sub-matrix at a time.

17. The method according to claim 11, further comprising;
dividing the memristive crossbar array into a plurality of independent sub-crossbar arrays; and
wherein the programming the plurality of the memristive devices with values, representing elements of the sub-matrices is performed such that each sub-matrix relates to a different one of the plurality of independent sub-crossbar arrays.

18. The method according to claim 11, wherein a scaling factor $\alpha_l$ for one of the sub-matrixes $A_l$ and a scaling factor $\beta_m$ for one of the sub-vectors is selected such that $$P\left\{|\alpha_{l'}\beta_{m'}e_{l'm'}| > \left|\sum_{l\neq l',m\neq m'}\alpha_l\beta_m w_{lm}\right|\right\} < \varepsilon \ \forall \ l', m'$$

is satisfied, wherein:
- $e_{l'm'}$ is an error value defined as difference between an exact result vector element $w_{lm}$ of the product of one of the sub-matrices and one of the sub-vectors and an actually measured related value;
- P is the probability that the norm value of $\alpha_l \beta_m e_{l'm'}$ is larger than the norm value of the sum $\Sigma_{l \neq l', m \neq m} \alpha_l \beta_m w_{lm}$; and
- $\varepsilon$ is a predefined probability tolerance value.

19. The method according to claim 11, wherein a scaling factor $\alpha_l$ for one of the sub-matrixes $A_l$ and a scaling factor $\beta_m$ for one of the sub-vectors is selected such that $$P\left\{\left|\sum_{l \cdot m} \alpha_l \beta_m e_{lm}\right| > |\alpha_{l'} \beta_{m'} w_{l'm'}|\right\} < \varepsilon \ \forall \ l', m'$$

is satisfied,
wherein:
- $e_{l'm'}$ is an error value defined as difference between an exact result vector element $w_{lm}$ of the product of one of the sub-matrices and one of the sub-vectors and an actually measured related product value;
- P is the probability that the norm value of the sum $\Sigma_{l,m} \alpha_l \beta_m e_{lm}$ is larger than the norm value $\alpha_{l'} \beta_{m'} w_{l'm'}$; and
- $\varepsilon$ is a predefined probability tolerance value.

20. A computer implemented method for a matrix-vector-multiplication by a memristive crossbar array comprising a plurality of memristive devices, the computer program product comprising a computer readable storage medium having program instructions embodied therewith, the program instructions being executable by a computer system to cause the computer systems to:
- program the plurality of the memristive devices with values representing elements of a sub-matrices such that each one of the memristive devices corresponds to one of the elements of the sub-matrices;
- apply elements of one of the multiple sub-vectors as input values to the memristive crossbar array to input lines of the memristive crossbar array resulting in partial results at output lines of the memristive crossbar array; and
- scale and sum the partial results building the product of the matrix and the vector.

* * * * *